United States Patent [19]
Loos

[11] Patent Number: 5,827,784
[45] Date of Patent: Oct. 27, 1998

[54] METHOD FOR IMPROVING CONTACT OPENINGS DURING THE MANUFACTURE OF AN INTEGRATED CIRCUIT

[75] Inventor: Peter J. Loos, Missouri City, Tex.

[73] Assignee: Texas Instruments Incorporated, Dallas, Tex.

[21] Appl. No.: 763,863

[22] Filed: Dec. 11, 1996

Related U.S. Application Data

[60] Provisional application No. 60/008,615 Dec. 14, 1995.
[51] Int. Cl.⁶ .............................. B08B 3/08; C25D 3/30; H01L 21/311
[52] U.S. Cl. ........................... 438/750; 134/1.3; 438/749; 438/751; 438/753; 438/754; 438/778; 438/906; 438/963
[58] Field of Search ............................. 134/1.3; 438/749, 438/750, 751, 753, 754, 906, 963, 778

[56] References Cited

U.S. PATENT DOCUMENTS

| | | | |
|---|---|---|---|
| 4,294,651 | 10/1981 | Ohmura | 438/750 |
| 5,229,334 | 7/1993 | Kato | 438/694 |
| 5,242,841 | 9/1993 | Smayling et al. | 148/DIG. 151 |
| 5,436,201 | 7/1995 | Chi et al. | 438/576 |
| 5,650,041 | 7/1997 | Gotoh et al. | 438/618 |
| 5,709,756 | 1/1998 | Ward et al. | 134/1.3 |

OTHER PUBLICATIONS

Tabata, Osamu, et al., *Anisotropic Etching of Silicon in TMAH Solutions,* Sensors and Actuators, A. 34 (1992), pp. 51–57. Also presented at the 6th Int'l Conf. on Solid–state Sensors & Actuators (Transducers '91), San Francisco, CA, Jun. 24–28, 1991.
Vossen, John L., & Kern, Werner, Editors, *Thin Film Processes:* Chemical Etching, RCA Laboratories, David Sarnoff Research Center, Princeton, New Jersey, Academic Press, 1978, ISBN 0–12–728250–5, pp. 403–425. (No Month).

Kikyuama, Hirohisa, et al., *Principles of Wet Chemical Processing in ULSI Microfabrication,* IEEE Transactions on Semiconductor Manufacturing, vol. 4, No. 1, Feb. 1991, pp. 26–35.
Kern, Werner, *RCA Review: Chemical Etching of Silicon, Germanium, Gallium Arsenide, and Gallium Phosphide,* RCA Laboratories, Princeton, NJ, vol. 39, Jun. 1978, pp. 278–308.
Petersen, K., *Silicon as a Mechanical Material,* Proceedings of the IEEE, vol. 70, No. 5, May, 1982, pp. 420–457.
Brat, T., et al., *The Influence of Tungsten–10 WT% Titanium Sputtering Target Purity and Density on VLSI Applications,* Tosoh SMD, Inc., Grove City, OH, Technical Note TKN 9.005A, pp. 1–9. [No Date].
Chemical Abstract No. 109:121071 which is an abstract of Japanese Patent Specification No. 63–114132 (May 1998).
Chemical Abstract No. 110:241174 which is an abstract of Japanese Patent Specification No. 01–014924 (Jan. 1989).

*Primary Examiner*—Anthony Green
*Attorney, Agent, or Firm*—Gerald E. Laws; Robert D. Marshall, Jr.; Richard L. Donaldson

[57] ABSTRACT

This is a method for improving contact openings during the manufacture of an integrated circuit. The process of forming a contact in an integrated circuit is often carried out rapidly, with imperfect control. As a result, incomplete removal of the insulating material may occur within the contact opening. In addition, the substrate material may be damaged to some extent within the contact opening by the contact formation process. In either case, high electrical resistance within the contact may result. Photo-resist may leave residue within the contact opening, low surface dopant concentrations, and insulative layer discontinuities may cause increased electrical resistance within the contact. A sequential application of two types of aqueous etchants will smooth the contact sidewall and remove a thin layer of relatively low dopant concentration at the surface of the substrate and other debris which may remain from the contact formation process and thereby allow lower resistance contacts to be formed.

12 Claims, 5 Drawing Sheets

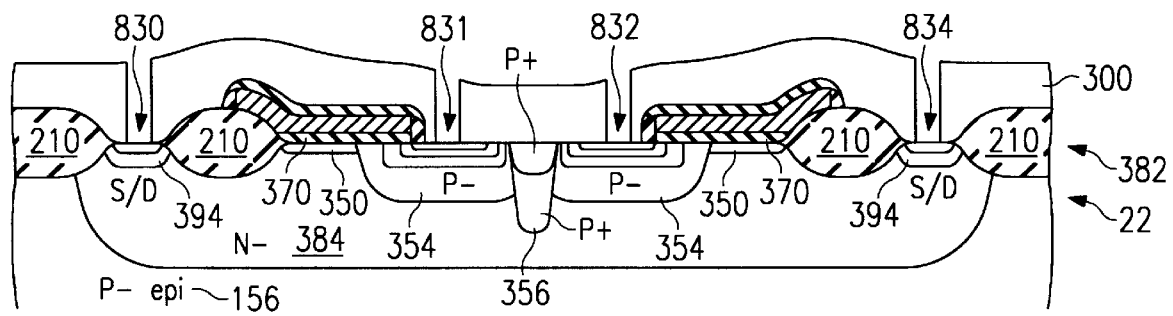
FIG. 4A
FIG. 4B
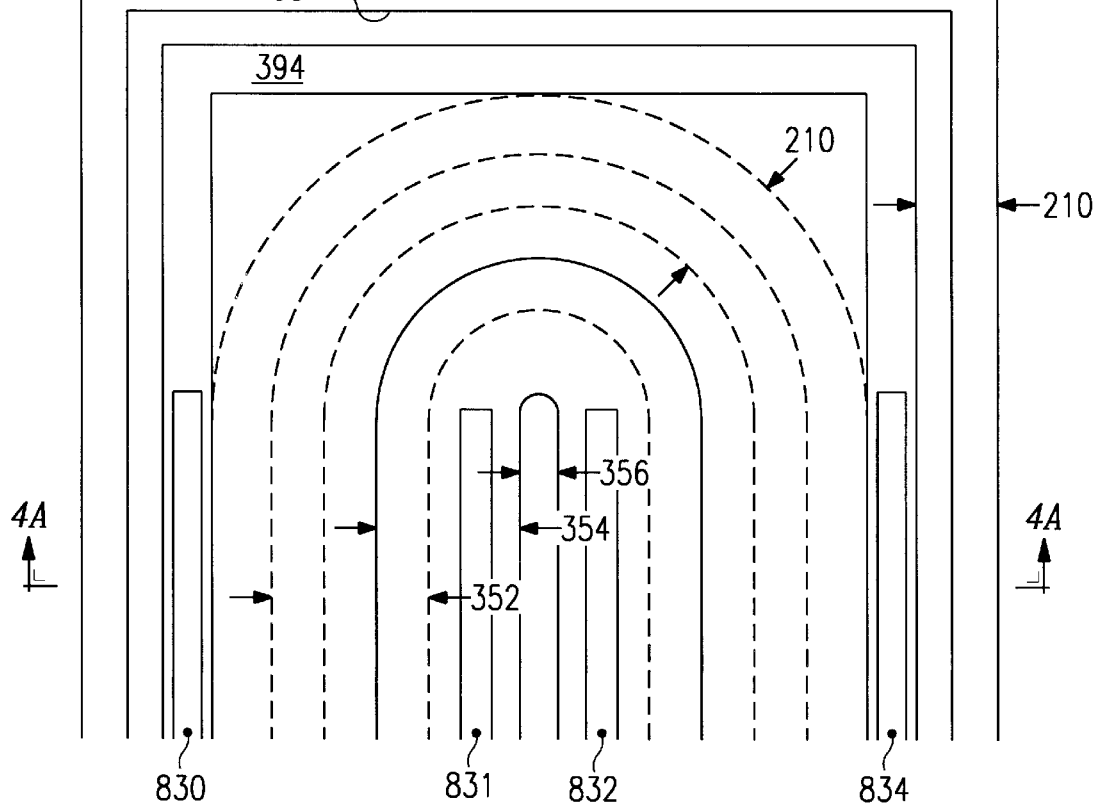

METHOD FOR IMPROVING CONTACT OPENINGS DURING THE MANUFACTURE OF AN INTEGRATED CIRCUIT

This application claims the benefit of U.S. Provisional Application No. 60/008,615 filed on Dec. 14, 1995.

CROSS REFERENCE TO RELATED APPLICATIONS

The following U.S. Patent is hereby incorporated by reference: U.S. Pat. No. 5,242,841, Method of Making LDMOS Transistor with Self-Aligned Source/Backgate and Photo Aligned Gate

FIELD OF THE INVENTION

This invention is in the field of semiconductor integrated circuits and relates primarily to the fabrication of contacts during the manufacture of integrated circuits.

BACKGROUND OF THE INVENTION

Semiconductor integrated circuits (ICs) are typically composed of a relatively thick substrate upon which multiple thin layers of insulating and conducting materials are deposited. The various layers of insulating and conducting materials may vary in thickness and composition. The thin conductive layers are patterned using suitable lithography techniques to form interconnections among the various devices comprising the IC. At numerous locations within each device, one or more conducting layers must make physical and electrical contact with the substrate. A contact is obtained by etching or otherwise forming an opening through the intervening insulating layers. Plasma etching is commonly used in conjunction with a patterned photo-resist layer to form the contact openings.

It is an object of the invention to form contacts that have low electrical resistance. Further objects and advantages of the invention will become apparent to those of ordinary skill in the art having reference to the following specification together with the drawings.

SUMMARY OF THE INVENTION

In accordance with the present invention, a method for improving contact openings during the manufacture of integrated circuits comprises a sequential application of two types of aqueous etchants to smooth the contact sidewall and to remove a thin layer of relatively low dopant concentration at the surface of the substrate and other debris which may remain from the contact formation process and thereby advantageously allow lower resistance contacts to be formed.

In accordance with the present invention, the first etchant is an acidic or neutral fluoride, while the second etchant is an alkaline hydroxide. Both etchants are maintained at a temperature between their respective boiling and freezing points. Each etchant is applied to the integrated circuit for a period of time which is greater than ten seconds and less than two hours.

The etchants may be augmented with surfactants, oxidizers, complexing agents and solvents. At the completion of etching, deionized water may be used to rinse the integrated circuit.

BRIEF DESCRIPTION OF THE DRAWINGS

Other features and advantages of the present invention will become apparent by reference to the following detailed description when considered in conjunction with the accompanying drawings, in which:

FIG. 4A is a sectional view of a lateral DMOS transistor manufactured in accordance with the process flow of FIG. 1, having contacts formed and cleaned in accordance with the present invention;

FIG. 4B is a plan view of the lateral DMOS transistor shown in FIG. 4A, FIG. 4A being taken substantially along line 4a–4a of FIG. 4B;

Corresponding numerals and symbols in the different figures and tables refer to corresponding parts unless otherwise indicated.

DETAILED DESCRIPTION OF PREFERRED EMBODIMENTS OF THE INVENTION

The process of forming a contact in an integrated circuit (IC) is often carried out rapidly, with imperfect control. It has been determined that, as a result, incomplete removal of the insulating material may occur within the contact opening. In addition, the substrate material may be damaged to some extent within the contact opening by the contact formation process. In either case, high electrical resistance within the contact may result.

After the contact is formed, it may be necessary to strip off photoresist used to create the contact pattern. It has been determined that this photoresist strip process may leave residue within the contact opening, thereby causing increased electrical resistance within the contact.

High contact resistance may also result from methods used to introduce dopant ions into the substrate. These methods often employ ion implantation and subsequent thermal treatments in a furnace. These can leave a thin layer of relatively low dopant concentration and low electrical conductivity at the surface of the semiconductor substrate. It has been determined that this thin layer may cause high contact resistance.

In many cases, a contact opening must penetrate through multiple insulating layers having diverse electrochemical properties. Many etchants are prone to remove material from such insulating layers at substantially different rates. It has been determined that this phenomenon can lead to undesirable roughness or discontinues along the sidewall of the contact opening which may result in improper filling of the contact opening and high contact resistance.

It has now been determined that a sequential application of two types of aqueous etchants will smooth the contact sidewall and remove a thin layer of relatively low dopant concentration at the surface of the substrate and other debris which may remain from the contact formation process and thereby advantageously allow lower resistance contacts to be formed.

Figure 1:
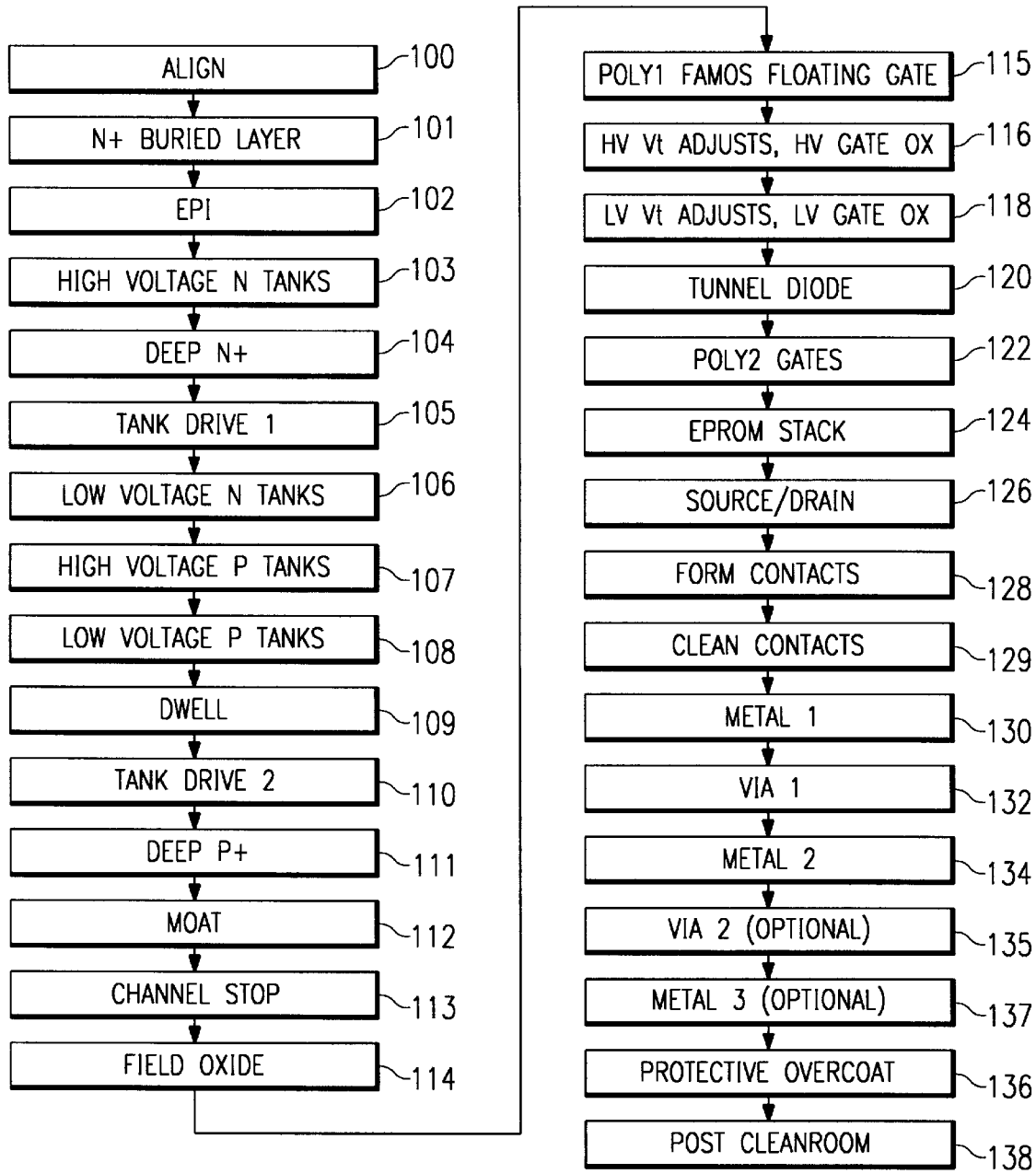
FIG. 1 is a process flowchart that gives an overview of a process used in fabricating an integrated circuit.
Figure 2:
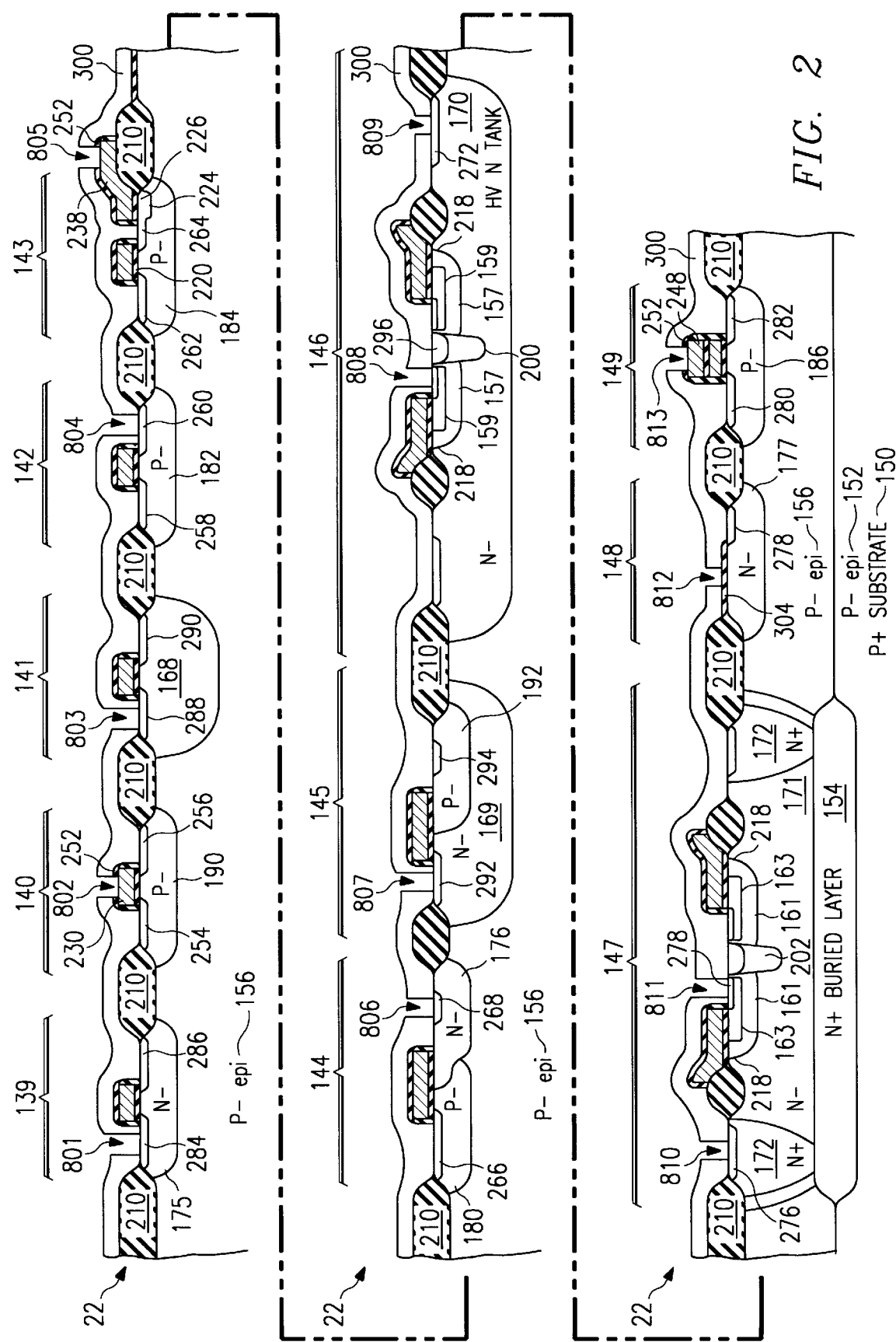
FIG. 2 is a sectional view of an integrated circuit formed in accordance with the process of FIG. 1 and incorporating contacts which have been cleaned according to the present invention.

FIG. 1 is a process flowchart that gives an overview of a process used in fabricating an integrated circuit. This process is useful for forming various types of devices, as shown in FIG. 2. A low-voltage p-channel field effect transistor 139, a low-voltage logic n-channel field effect transistor 140 (devices 139 and 140 being designed for voltages at or below about fourteen volts), a p-channel isolation or gating field-effect transistor 141 for an EEPROM array, an n-channel isolation or gating field-effect transistor 142 for an EEPROM array, electrically erasable programmable read-only memory Fowler-Nordheim tunneling cell 143, a drain-extended n-channel field effect transistor 144, a drain-extended p-channel field effect transistor 145, a lateral double-diffused "metal" oxide semiconductor (LDMOS) n-channel field effect transistor 146, a vertical double-diffused "metal" oxide semiconductor (VDMOS) n-channel field effect transistor 147, a Schottky diode 148 and a floating gate avalanche metal oxide semiconductor (FAMOS) electrically programmable read-only memory (EPROM) cell 149 may all be formed on the same integrated circuit chip. Devices 141–147 and 149 are designed to be subjected to voltages and/or current densities much greater than the low-voltage logic transistors 139 and 140.

Steps 100–128 and 130–138 of FIG. 1 are described in detail in U.S. Pat. No. 5,242,841, which was incorporated by reference. For completeness, a summary of that description is included herein.

In FIG. 1, alignment marks are formed by etching targets into the a p-type semiconductor substrate in ALIGN step 100. Next, process step 101 forms a (p−) epitaxial silicon layer and selectively creates an (n+) buried layer in the p-type epitaxial silicon layer. The (n+) buried layer may be used as the drain for vertical double diffused "metal oxide semiconductor (VDMOS) n-channel power transistors. A buried (n+) layer is also used as the collector for a vertical npn bipolar transistor, as will be later described. The buried (n+) layer, combined with deep (n+) diffusions, can form isolated NMOS transistors and (p−) resistors.

The (n+) buried layer is covered in step 102 by a layer of epitaxial (p−) silicon of a thickness suitable to allow subsequent thermal processing. Step 103 fabricates (n−) transistor tanks for the high voltage power transistors. These tanks are large diffused regions in which the power transistors are fabricated.

At step 104, a deep (n+) implant occurs in order to connect the (n+) buried layers to surface contacts for the vertical transistors. The (n−) high voltage diffusion and deep (n+) implants are annealed at high temperature in TANK DRIVE step 105.

Steps 101, 102, and 104 may be skipped if associated structures are not required for a given IC design.

At step 106, low-voltage device (n−) tanks are created to enclose conventional low-voltage ($V_{dd}$±14 volts) logic field effect transistors, and components of, for example, vertical and lateral DMOS n-channel power transistors, and drain-extended n-channel power transistors. Low-voltage n-tanks are also used to enclose Schottky diodes.

At step 107, a plurality of high-voltage p-tanks are created in the epitaxial layer. The high-voltage p-tanks are used as tanks for devices such as 18 volt EEPROM gating transistors, EEPROM cells, and drain extended n-channel transistors. Step 108 involves the fabrication of low-voltage p-tanks as, for example, enclosures for low-voltage n-channel field effect logic transistors, as drains for extended drain p-channel field effect transistors, and as tanks for floating gate avalanche injection electrically programmable read-only memory (FAMOS EPROM) cells.

At step 109, one or more DWELL regions are masked and implanted to form self-aligned (p−) and (n+) diffusions. At step 110, all tank/well dopants are diffused to nearly final depths by a high temperature operation.

At step 111, deep (p+) implantations are performed, for example, to form deep back gates for lateral and vertical DMOS n-channel power transistors. This step can be omitted if deep (p+) implantations are not needed.

At step 112, moat or isolating oxide regions surrounding active device areas are defined with a mask. Channel stop implants that further isolate the devices from each other are carried out at step 113 in selected (p−) regions, with self-alignment to the active device areas. In step 114, the previously defined isolating regions have oxide grown on the face of the semiconductor epitaxial layer.

Step 115 concerns growing a first gate oxide and the subsequent formation of a first-level polycrystalline silicon (poly 1) conductor. For example, floating gate avalanche injection "metal" oxide semiconductor (FAMOS) EPROM cell, double-level poly EEPROM cells, and poly-poly capacitors use first level polycrystalline silicon conductors.

Next, at step 116, the gate oxide for the control gates of the high-voltage and high power transistors is grown and threshold voltage $V_t$ adjust implants are performed for these transistors. The $V_t$ adjust forms a (p−) region at the surface of the DMOS transistors, self-aligned to active areas by the field oxide.

At step 118, similar low-voltage $V_t$ adjust implants are performed through the high-voltage gate oxide layer. For the low voltage transistors, the relatively thick high voltage gate oxide is removed and a thin gate oxide is thermally grown.

Step 120 concerns a portion of the EEPROM cell fabrication, and includes an (n+) Fowler-Nordheim tunnel diode implant and the formation of a thin tunnel oxide over the implant.

At step 122, a second-level polysilicon (POLY 2) layer is deposited, doped, patterned and etched to define gates for low- and high-voltage field effect transistors, single-level poly EEPROM cells, and to partially or completely define the control gate for FAMOS n-channel EPROM cells, double-level poly EEPROM cells and poly-poly capacitors.

At step 124, a patterning and etching of certain double-level poly gate stacks occurs to complete the definition of the FAMOS n-channel EPROM cell control gates and floating gates, and, in one embodiment, stack-etched EEPROM cells. EPROM (n+) cell implants can be done with the stack pattern.

In step 126, several source/drain implants and diffusions occur. The polysilicon transistor and memory cell gates have sidewall oxides formed adjacent their lateral edges and cap oxides on other exposed polysilicon surfaces. A lightly doped drain (LDD) (n) type implant is made into the surface source/drain regions of the n-channel field effect transistors immediately before a main (n+) source/drain implantation. The LDD and (n+) implantations are annealed, followed by (p+) source/drain patterning and implantation. The n-type source/drain implantation step is further used to form surface contact regions for back gates for p-channel transistors, and the (p+) source/drain implantation step is further used to form surface contact regions for back gates for n-channel transistors.

In step 128, the formation of the semiconductor portions of the fabricated devices is essentially complete and all that is left is the conductive interconnection of these devices with each other and to the outside world, with the exception of Schottky diode devices. An oxide is deposited in step 128 and is patterned and etched to produce contact windows.

According to the present invention, after formation of the contact opening (by etching or other methods) and photoresist strip but before deposition of a conducting layer intended to contact the substrate, the contact opening is cleaned in step 129. This inventive cleaning step is described in detail after the final steps of the process are described.

At step 130, platinum is deposited and PtSi formed at contacts and Schottky diodes. Next, the first level of metal is deposited, patterned and etched. At step 132, a second-level of insulator is deposited over the first metal and vias are formed to the first metal. The second metal itself is deposited, patterned and etched at step 134. The sequence of depositing an insulator, forming vias, and forming metal interconnect can be continued as illustrated by steps 135 and 137. A protective overcoat is added at 136, and various post-clean room processes are performed on the chip at step 138.

According to the present invention, cleaning step 129 has two primary benefits. First, it sequentially removes from within the contact opening: (1) residual amounts of insulating material and photoresists, (2) damaged substrate material and (3) substrate material having low dopant concentration and conductivity, and thereby advantageously minimizes electrical resistance within the contact. Second, along the contact sidewall it removes material from multiple diverse insulating layers at comparable rates, thereby minimizing sidewall roughness and discontinuities.

Cleaning step 129 is a sequential application of two aqueous etchant solutions: (1) acidic or neutral fluoride and (2) alkaline hydroxide, each maintained at a temperature between its freezing and boiling points. Composition of the fluoride solution is chosen for a given application to etch insulating layers at rates which are comparable and of practical importance. Composition of the hydroxide solution is chosen for a given application to etch semiconducting materials at rates which are comparable and of practical importance.

Various sources or methods of obtaining such aqueous fluoride and hydroxide will be apparent to experienced practitioners. Fluoride may be obtained from gases such as hydrogen fluoride, liquids such as hydrofluoric acid or solids such as ammonium fluoride, or combinations thereof. Hydroxide may be obtained by utilizing gases such as ammonia, liquids such as ammonium hydroxide solution and solids such as tetramethylammonium hydroxide, its hydrates or combinations thereof.

Furthermore, the etchants may be augmented by the addition of surfactants, oxidizers, complexing agents and solvents, for the purposes of adjusting the surface wetting or particle dispersing characteristics of the etchants, the rate or spatial uniformity with which the materials or their constituent chemical elements are etched, the nature of the etch reaction end products, or dissolution of either contaminants or said end products.

In addition, as will be apparent to experienced practitioners, deionized water rinse procedures may also be employed in conjunction with step 129.

For contacts through layers of borophosphosilicate glass and silicate glass, atop a silicon substrate highly doped at selected locations with boron, antimony, arsenic, phosphorous or nitrogen, the following aqueous solutions are used: a first etchant of approximately 0.5 weight % hydrogen fluoride and approximately 25 weight % ammonium fluoride held at about 24 degrees centigrade, and a second etchant of approximately 11 weight % tetramethylammonium hydroxide held at about 60 degrees centigrade. Immersion time in each etchant will depend on additional details regarding the device being processed and on required contact resistance values for that device.

Immersion times for step 129 of FIG. 1 are as follows. Immersion time for etchant 1 is 90 seconds (assuming a solution of 0.5 wt % HF and 25 wt % NH4F at 24 degrees C.). Immersion time for etchant 2 is 23 seconds (assuming a solution of 11 wt % TMAH at 60 degrees C.). Immersion times for various embodiments may be optimized as discussed later.

FIG. 2 is a sectional view of an IC which has contacts 801–813 formed in various types of devices 139–149. Insulative layer 300 has openings which have been formed and cleaned in accordance with the present invention. Contact 801 is formed in drain/source 284. Contact 802 is formed on polysilicon gate 230 which has an opening through insulative layer 300 and cap insulator 252. Contact 812 is formed over insulator 304 of Schottky diode 148. Those skilled in the art will recognize that additional contacts which are not shown in this sectional view exist to provide connectivity to all of the various operational regions of each device.

Figure 3A:
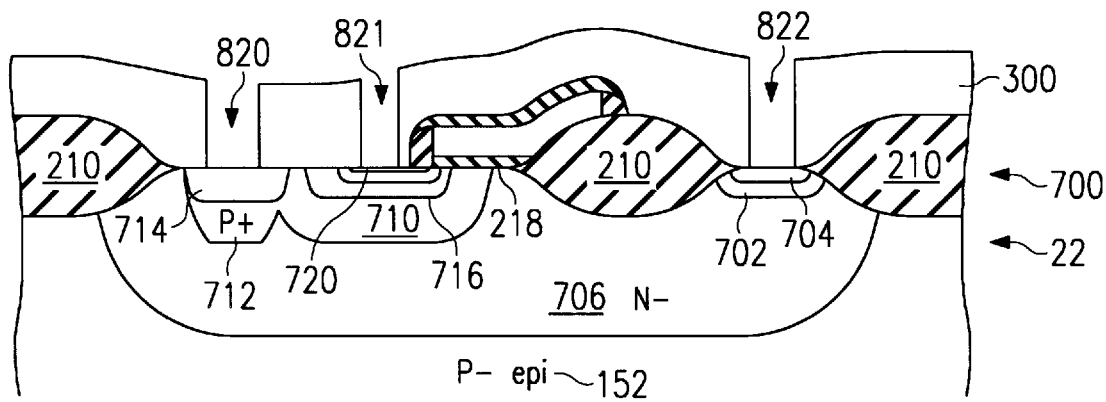
FIG. 3A is a detailed sectional view of a lateral diffused MOS (LDMOS) n-channel transistor manufactured in accordance with the process flow of FIG. 1, having contacts formed and cleaned in accordance with the present invention.

FIG. 3a is a detailed sectional view of a lateral diffused MOS (LDMOS) n-channel transistor 700 manufactured in accordance with the process flow of FIG. 1. Contacts 820–822 are formed and cleaned in accordance with the present invention.

Figure 3B:
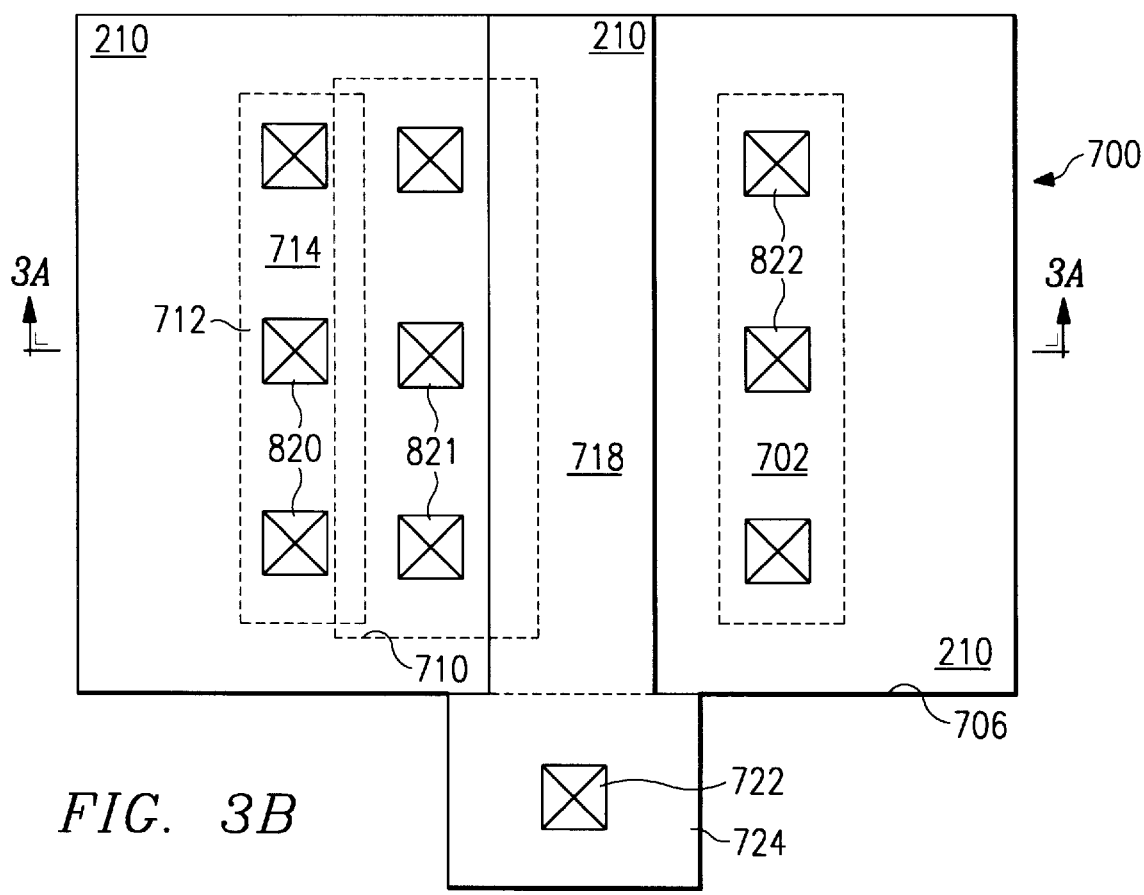
FIG. 3B is a plan view of the LDMOS transistor shown in FIG. 3B, FIG. 3A being taken substantially along line 3A—3A of FIG. 3B.

FIG. 3b is a plan view of the LDMOS transistor shown in FIG. 3a, FIG. 3a being taken substantially along line 3a—3a of FIG. 3b. Contacts 820–822 are shown as square, but one skilled in the art will recognize that other shapes, such as round, may be employed.

FIG. 4A is a sectional view of a lateral DMOS transistor 382 manufactured in accordance with the process flow of FIG. 1. Contacts 830–834 are formed and cleaned in accordance with the present invention.

FIG. 4B is a plan view of the lateral DMOS transistor shown in FIG. 4A, FIG. 4A being taken substantially along line 4a—4a of FIG. 4B. Contacts 830–834 are shown as elongated trenches, but one skilled in the art will recognize that other shapes, such as fore-shortened rectangular or oval, may be employed.

Figure 4C:
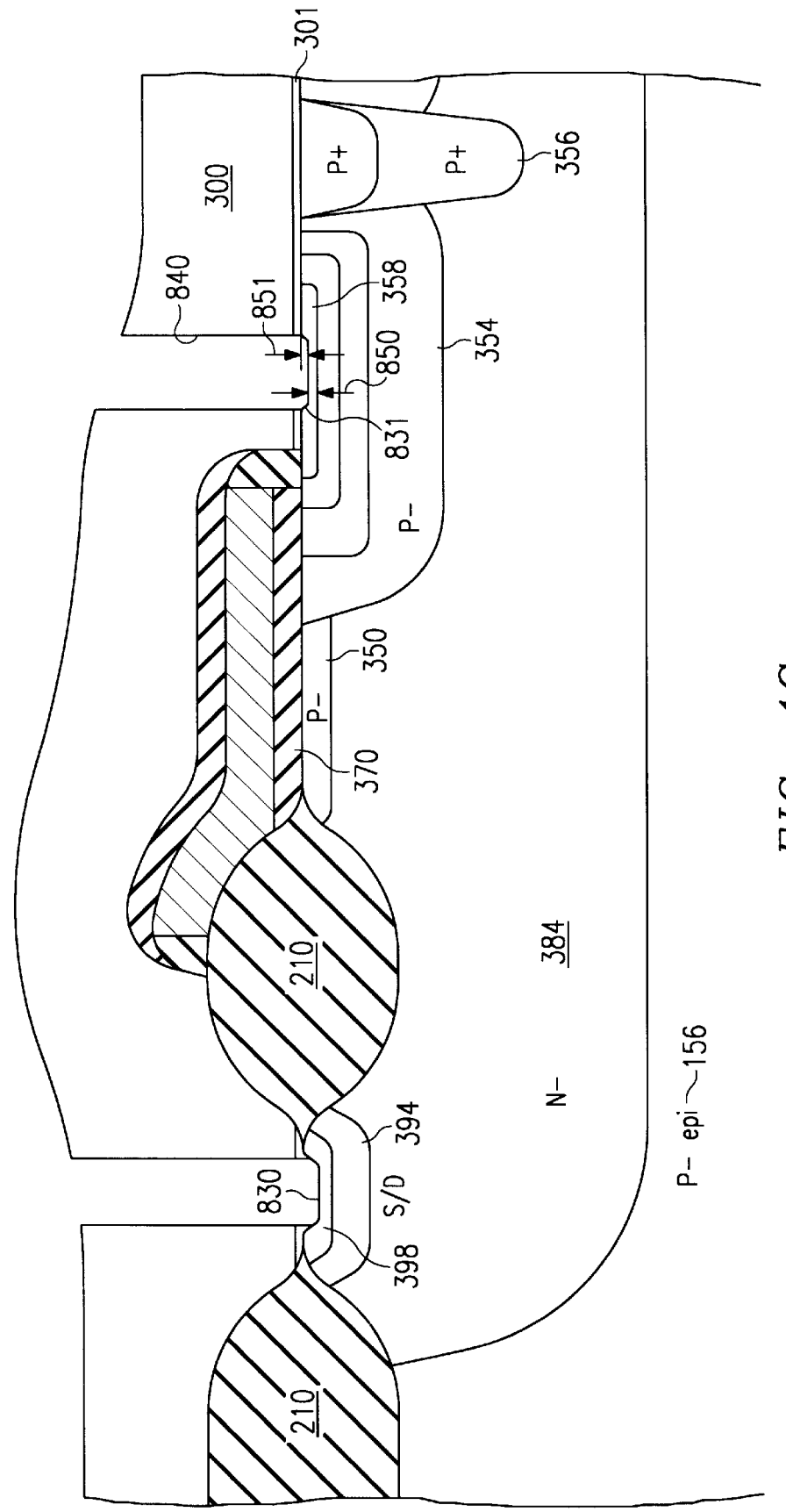
FIG. 4C is an enlarged sectional view of a portion of the DMOS transistor of FIG. 4A, showing details of contacts cleaned in accordance with the present invention.

FIG. 4C is an enlarged sectional view of FIG. 4A to illustrate factors that should be considered in optimizing the immersion times in etchant 1 and etchant 2. Immersion time in etchant 1 and etchant 2 are optimized somewhat differently. In either case, however, samples of a particular device are processed using etch times varying over a wide range. Then the resulting finished products are measured in various ways, as described below.

Etchant 1 primarily removes nonconductors of electricity. Hence, electrical measurements are not the primary means for optimizing etchant 1 immersion time. Instead, cross-sectional photomicrographs or ellipsometry or other means for measuring dielectric film thickness are used. In FIG. 4C, oxide layer 301 is formed during processing of device 382 and is overlaid by insulative layer 300. In order to form a good contact 830 and 831, both insulative layer 300 and oxide 301 should be completely removed from the region in which contact 830 and 831 will be formed. The optimal etch time is the least one which consistently removes the thickness of dielectric seen or expected to exist on the device. Electrical resistance and product yield are used as secondary measures. Optimal immersion time corresponds to the lowest resistance and greatest product yield.

Etchant 2 primarily removes semiconducting material. Hence, to optimize etchant 2 immersion times, the primary measureables are electrical resistance and electrical leakage of contacts. The optimal etch time is the one for which resistance and leakage are minimized simultaneously. Secondarily, in optimizing immersion times in etchant 2 cross-sectional photomicrographs may be employed to measure the distance etched into each type of doped region in the semiconducting substrate. The distance etched 851 must be a small fraction of the doped region's remaining thickness 850, placing an upper limit on etch time. Finally, the optimal etchant 2 immersion time maximizes product yield.

For both etchants there are lower and upper limits on immersion time unrelated to product characteristics. Immersion times greater than about 10 seconds are needed if the process is manually controlled, so that human operators' normal variability in loading and unloading the product wafers are a small fraction of the total etch time. The etch time is not practical if it requires more than a few hours of immersion.

An advantage of the present invention is that it is inexpensive compared to other methods of cleaning contact openings, such as (A) dry plasma etchant or (B) or a combination of (A) and aqueous fluoride etchants.

Another advantage of the present invention is that electrical resistance of the resulting contacts is low compared to those produce by aqueous fluoride alone.

Another advantage of the present invention is that a smooth contact sidewall 840 is formed and where diverse insulating layers, such as 300 and 301, meet only negligible roughness and discontinuities remain.

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. For example, substrates other than Si, such as Ge or GaAs with various types of oxide insulating layers may be processed according to the present invention. It is therefore contemplated that the appended claims will cover any such modifications of the embodiments as fall within the true scope and spirit of the invention.

What is claimed is:

1. A method for manufacturing an integrated circuit, comprising the steps of:
    providing a semiconductive substrate having a plurality of regions which have been doped to increase conductivity, said substrate being overlaid with a layer of insulative material;
    forming at least one contact opening having sidewalls in the insulative layer to expose a contact region on a top surface of at least one of the doped regions of the substrate; and
    cleaning the contact opening and contact region after the step of forming the contact opening with a sequential application of two different aqueous etchants.

2. The method of claim 1, further comprising forming a conductive material in the contact opening after the step of cleaning the contact opening for an interconnect, whereby a low resistance exists between the conductive material and the substrate.

3. The method of claim 1, in which the step of cleaning the contact opening comprises:
    applying a first aqueous etchant to the contact opening to smooth the contact opening sidewalls, wherein the first etchant is an acidic or neutral fluoride; and
    applying a second aqueous etchant to the contact opening to remove a thin layer of semiconductive substrate from the contact region of the doped region, the doped region having a thickness, such that the thin layer removed is a small fraction of the thickness of the doped region, wherein the second etchant is an alkaline hydroxide.

4. The method of claim 1 in which:
    both etchants are maintained in a liquid phase at a temperature between their respective boiling and freezing points.

5. The method of claim 4, in which the etchants are augmented by one or more of the following: surfactants, oxidizers, complexing agents, and solvents.

6. The method of claim 3, further comprising rinsing the contact opening with deionized water after the step of cleaning the contact opening.

7. The method of claim 6, in which during the step of cleaning the contact opening the integrated circuit is immersed in each etchant for a period greater than 10 seconds and less than 2 hours.

8. The method of claim 1, in which the insulative layer comprises two or more layers of insulative material.

9. The method of claim 1, wherein the step of forming at least one contact opening comprises etching the insulative layer with a plasma etchant.

10. The method of claim 8, wherein the insulative layer comprises a first layer of borophosphosilicate glass and a second layer of silicate glass.

11. A method for manufacturing an integrated circuit comprising the steps of:
    providing a semiconductive substrate of silicon having a plurality of regions which have been doped to increase conductivity, said substrate being overlaid with one or more layers of insulative material comprising borophosphosilicate glass or silicate glass;
    forming at least one contact opening having sidewalls in the insulative layer to expose a contact region on a top surface of at least one of the doped regions of the substrate; and
    cleaning the contact opening and contact region with a sequential application of a first aqueous etchant and a second aqueous etchant;
    the first etchant being approximately 0.5 weight % hydrogen fluoride and approximately 25 weight % ammonium fluoride held at about 24 degrees centigrade; and
    the second etchant being approximately 11 weight % tetramethyl-ammonium hydroxide held at about 60 degrees centigrade.

12. The method of claim 11, in which the integrated circuit is immersed in the first etchant for approximately 90 seconds and in the second etchant for approximately 23 seconds.

* * * * *